United States Patent
Wang et al.

(10) Patent No.: US 11,568,775 B2
(45) Date of Patent: Jan. 31, 2023

(54) GATE DRIVING UNIT CIRCUIT AND METHOD OF DRIVING THE SAME, GATE DRIVING CIRCUIT AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Guangxing Wang, Beijing (CN); Kan Zhang, Beijing (CN); Bin Zhang, Beijing (CN); Pengming Chen, Beijing (CN); Dianzheng Dong, Beijing (CN); Qiang Zhang, Beijing (CN); Wenpeng Xu, Beijing (CN); Heng Lu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 414 days.

(21) Appl. No.: 16/098,046

(22) PCT Filed: Jan. 29, 2018

(86) PCT No.: PCT/CN2018/074455
§ 371 (c)(1),
(2) Date: Oct. 31, 2018

(87) PCT Pub. No.: WO2019/007043
PCT Pub. Date: Jan. 10, 2019

(65) Prior Publication Data
US 2022/0122502 A1  Apr. 21, 2022

(30) Foreign Application Priority Data

Jul. 7, 2017  (CN) .......................... 201710552183.1

(51) Int. Cl.
*G09G 3/20* (2006.01)

(52) U.S. Cl.
CPC ....... *G09G 3/20* (2013.01); *G09G 2310/0267* (2013.01); *G09G 2310/0286* (2013.01); *G09G 2310/061* (2013.01); *G09G 2310/08* (2013.01)

(58) Field of Classification Search
CPC ............. G09G 3/20; G09G 2310/0267; G09G 2310/0286; G09G 2310/061; G09G 2310/08
See application file for complete search history.

(56) References Cited

U.S. PATENT DOCUMENTS 10,127,995 B2  11/2018 Chen et al.
10,311,795 B2   6/2019 Chen et al.
(Continued)

FOREIGN PATENT DOCUMENTS

CN  102881248 A  1/2013
CN  105047228 A  11/2015
(Continued)

OTHER PUBLICATIONS

Office Action dated May 20, 2019 issued in corresponding to Chinese Application No. 201710552183.1.

*Primary Examiner* — David Tung
(74) *Attorney, Agent, or Firm* — Nath, Goldberg & Meyer; Joshua B. Goldberg

(57) ABSTRACT

The present application provides a gate driving unit circuit and a method of driving the same, a gate driving circuit and a display apparatus. The gate driving unit circuit includes a shift register and a plurality of driving signal output sub-circuits. Each driving signal output sub-circuit corresponds to one of gate lines on an array substrate, is coupled to a first power supply terminal and a signal output terminal of the shift register, and also coupled to a corresponding one of driving scan signal lines. Each driving signal output sub-(Continued)

circuit is configured to output, under the control of a signal output by the signal output terminal of the shift register, a driving scan signal provided by the corresponding driving scan signal line or an OFF voltage provided by the first power supply terminal to the corresponding gate line.

7 Claims, 9 Drawing Sheets

(56) References Cited

U.S. PATENT DOCUMENTS

| | | | |
|---|---|---|---|
| 2003/0174118 A1* | 9/2003 | Sato | G11C 19/184 |
| | | | 345/100 |
| 2011/0135050 A1 | 6/2011 | Liu | |
| 2016/0012911 A1* | 1/2016 | Han | G11C 19/28 |
| | | | 377/64 |
| 2016/0049128 A1* | 2/2016 | Shao | G09G 3/3677 |
| | | | 377/64 |
| 2016/0189683 A1* | 6/2016 | Chen | G09G 5/18 |
| | | | 345/99 |
| 2017/0061855 A1* | 3/2017 | Tsai | G09G 3/3266 |

FOREIGN PATENT DOCUMENTS

| | | |
|---|---|---|
| CN | 105590612 A | 5/2016 |
| CN | 205282054 U | 6/2016 |
| CN | 105869566 A | 8/2016 |
| CN | 106023943 A | 10/2016 |

* cited by examiner

GATE DRIVING UNIT CIRCUIT AND METHOD OF DRIVING THE SAME, GATE DRIVING CIRCUIT AND DISPLAY APPARATUS

CROSS-REFERENCE TO RELATED APPLICATION

This is a National Phase Application filed under 35 U.S.C. 371 as a national stage of PCT/CN2018/074455, filed on Jan. 29, 2018, an application claiming the benefit of Chinese Patent Application No. 201710552183.1, filed on Jul. 7, 2017, the contents of which are incorporated herein by reference in the entirety.

TECHNICAL FIELD

The present disclosure relates to a gate driving unit circuit and a method of driving the same, a gate driving circuit and a display apparatus.

BACKGROUND

In an existing gate driving circuit, each phase of shift register can drive only one gate line, so the number of shift registers required in the entire gate driving circuit is large, resulting in that the entire gate driving circuit occupies a larger space, which is disadvantageous to the implementation of a narrow bezel.

SUMMARY

The present disclosure proposes a gate driving unit circuit and a method of driving the same, a gate driving circuit and a display apparatus.

In an aspect, the present disclosure provides a gate driving unit circuit, which includes a shift register and a plurality of driving signal output sub-circuits, wherein each of the driving signal output sub-circuits is coupled to a corresponding one of a plurality of gate lines on an array substrate, coupled to a first power supply terminal and a signal output terminal of the shift register, and coupled to a corresponding and different one of driving scan signal lines, and time periods in which respective driving scan signals provided by the driving scan signal lines are of an ON voltage do not overlap with each other; and each of the driving signal output sub-circuits is configured to output, under control of a signal output by the signal output terminal of the shift register, a driving scan signal provided by the corresponding one of the driving scan signal lines or an OFF voltage provided by the first power supply terminal to the corresponding one of the gate lines.

In some embodiments, the shift register includes a pre-charge reset sub-circuit, a pulling-down node control sub-circuit, an output control sub-circuit and an output reset sub-circuit, the pre-charge reset sub-circuit, the pulling-down node control sub-circuit and the output control sub-circuit being coupled to a pulling-up node, and the output control sub-circuit and the output reset sub-circuit being coupled to a pulling-down node;

the pre-charge reset sub-circuit is configured to perform a pre-charge processing on the pulling-up node under control of a pre-charge signal input by a pre-charge signal input terminal and a reset processing on the pulling-up node under control of a reset signal input by a reset signal input terminal;

the output control sub-circuit is coupled to a first clock signal terminal, and configured to transmit a first clock signal provided by the first clock signal terminal to the signal output terminal under control of a voltage level at the pulling-up node;

the pulling-down node control sub-circuit is coupled to a second clock signal terminal, and configured to transmit a second clock signal provided by the second clock signal terminal to the pulling-down node under control of the voltage level at the pulling-up node:

the output reset sub-circuit is configured to reset the signal output terminal under control of a voltage level at the pulling-down node; and the first clock signal and the second clock signal have a same period and a phase difference of a half of the period.

In some embodiments, the driving signal output sub-circuit includes a first transistor and a second transistor;

a control electrode of the first transistor is coupled to the signal output terminal of the shift register, a first electrode of the first transistor is coupled to the corresponding one of the driving scan signal lines, and a second electrode of the first transistor is coupled to the corresponding one of the gate lines; and a control electrode of the second transistor is coupled to the signal output terminal of the shift register, a first electrode of the second transistor is coupled to the first power supply terminal, and a second electrode of the second transistor is coupled to the corresponding one of the gate lines.

In some embodiments, one of the first transistor and the second transistor is an N-type transistor, and the other of the first transistor and the second transistor is a P-type transistor.

In some embodiments, the driving signal output sub-circuit includes a first transistor and a second transistor;

a control electrode of the first transistor is coupled to the signal output terminal of the shift register, a first electrode of the first transistor is coupled to the corresponding one of the driving scan signal lines, and a second electrode of the first transistor is coupled to the corresponding one of the gate lines; and a control electrode of the second transistor is coupled to the second clock signal terminal, a first electrode of the second transistor is coupled to the first power supply terminal, and a second electrode of the second transistor is coupled to the corresponding one of the gate lines.

In some embodiments, the gate driving unit circuit further includes a voltage synchronization sub-circuit including a fourth transistor and a first capacitor;

a control electrode of the fourth transistor is coupled to the pulling-up node, a first electrode of the fourth transistor is coupled to a second power supply terminal, and a second electrode of the fourth transistor is coupled to a first end of the first capacitor at a voltage synchronization node; and a second end of the first capacitor is coupled to the first clock signal terminal.

In some embodiments, the voltage synchronization sub-circuit further includes a fifth transistor, a control electrode of the fifth transistor is coupled to the second clock signal terminal, a first electrode of the fifth transistor is coupled to the second power supply terminal, and a second electrode of the fifth transistor is coupled to the voltage synchronization node.

In some embodiments, the driving signal output sub-circuit includes a first transistor and a second transistor;

a control electrode of the first transistor is coupled to the signal output terminal of the shift register, a first electrode of the first transistor is coupled to the corresponding one of the driving scan signal lines, and a second electrode of the first transistor is coupled to the corresponding one of the gate lines; and a control electrode of the second transistor is coupled to the voltage synchronization node, a first electrode of the second transistor is coupled to the first power supply terminal, and a second electrode of the second transistor is coupled to the corresponding one of the gate lines.

In some embodiments, the driving signal output sub-circuit further includes a third transistor;

a control electrode of the third transistor is coupled to the second clock signal terminal, a first electrode of the third transistor is coupled to the first power supply terminal, and a second electrode of the third transistor is coupled to the corresponding one of the gate lines.

In some embodiments, the number of the driving signal output sub-circuits is two to eight.

In some embodiments, the number of the driving signal output sub-circuits is six.

In some embodiments, the plurality of driving signal output sub-circuits are arranged in a column direction.

The present disclosure further provides a gate driving circuit, including: N cascaded stages of gate driving unit circuits, each of the gate driving unit circuits being the above-described gate driving unit circuit, where N is an integer greater than or equal to two;

the signal output terminal of the shift register of each of a first stage to a (N−1)-th stage of gate driving unit circuits, among the N cascaded stages of gate driving unit circuits, is coupled to the pre-charge signal input terminal of the shift register of a subsequent stage of gate driving unit circuit, among the N cascaded stages of gate driving unit circuits; and the signal output terminal of the shift register of each of a second stage to a N-th stage of gate driving unit circuits, among the N cascaded stages of gate driving unit circuits, is coupled to the reset signal input terminal of the shift register of a previous stage of gate driving unit circuit, among the N cascaded stages of gate driving unit circuits.

The present disclosure further provides a display apparatus, including the above-described gate driving circuit.

The present disclosure further provides a method of driving a gate driving unit circuit, the gate driving unit circuit being the above-described gate driving unit circuit, the method including:

outputting an operating voltage by the signal output terminal of the shift register, and transmitting, by each of the driving signal output sub-circuits under control of the operating voltage, a driving scan signal provided by the corresponding one of the driving scan signal lines to the corresponding one of the gate lines; and outputting a non-operating voltage by the signal output terminal of the shift register, and transmitting, by each of the driving signal output sub-circuits under control of the non-operating voltage, the OFF voltage provided by the first power supply terminal to the corresponding one of the gate lines.

DETAILED DESCRIPTION

To make those skilled in the art better understand the technical solutions of the present disclosure, a gate driving unit circuit and a method of driving the same, a gate driving circuit and a display apparatus according to the present disclosure will be described in detail below in conjunction with the accompanying drawings.

It should be noted that transistors used in embodiments of the present disclosure may be thin film transistors or field effect transistors or other devices having same or similar characteristics. Since a source electrode and a drain electrode of a transistor used are symmetrical, there is no difference between the source electrode and the drain electrode thereof. In the embodiments of the present disclosure, to distinguish the source electrode and the drain electrode of the transistor, one of the source and drain electrodes is referred to as a first electrode, the other of the source and drain electrodes is referred to as a second electrode, and a gate electrode of the transistor is referred to as a control electrode. In addition, the transistors can be divided into N-type ones and P-type ones depending on the characteristics thereof. In a case of a N-type transistor, the first electrode is a source electrode of the N-type transistor, the second electrode is a drain electrode of the N-type transistor, and the transistor is turned on when a high level is applied to a gate electrode thereof; and it is opposite in a case of a P-type transistor.

In addition, in the present disclosure, when a transistor in a pixel unit coupled to a gate line is an N-type transistor, the driving voltage for driving the gate line is a high level voltage, and the OFF voltage for resetting the gate line is a low level voltage. When the transistor in the pixel unit coupled to the gate line is a P-type transistor, the driving voltage for driving the gate line is a low level voltage, and the OFF voltage for resetting the gate line is a high level voltage. In the following embodiments, an exemplary description is given by taking the transistor in the pixel unit coupled to the gate line being an N-type transistor as an example.

Herein, a signal being of an "ON voltage" means that the voltage of the signal turns on the transistor driven by the signal, and a signal being of an "OFF voltage" means that the voltage of the signal turns off the transistor driven by the signal. For example, when the transistor driven by a signal is of N-type, the ON voltage of the signal may be high level and the OFF voltage of the signal may be low level.

Figure 1:
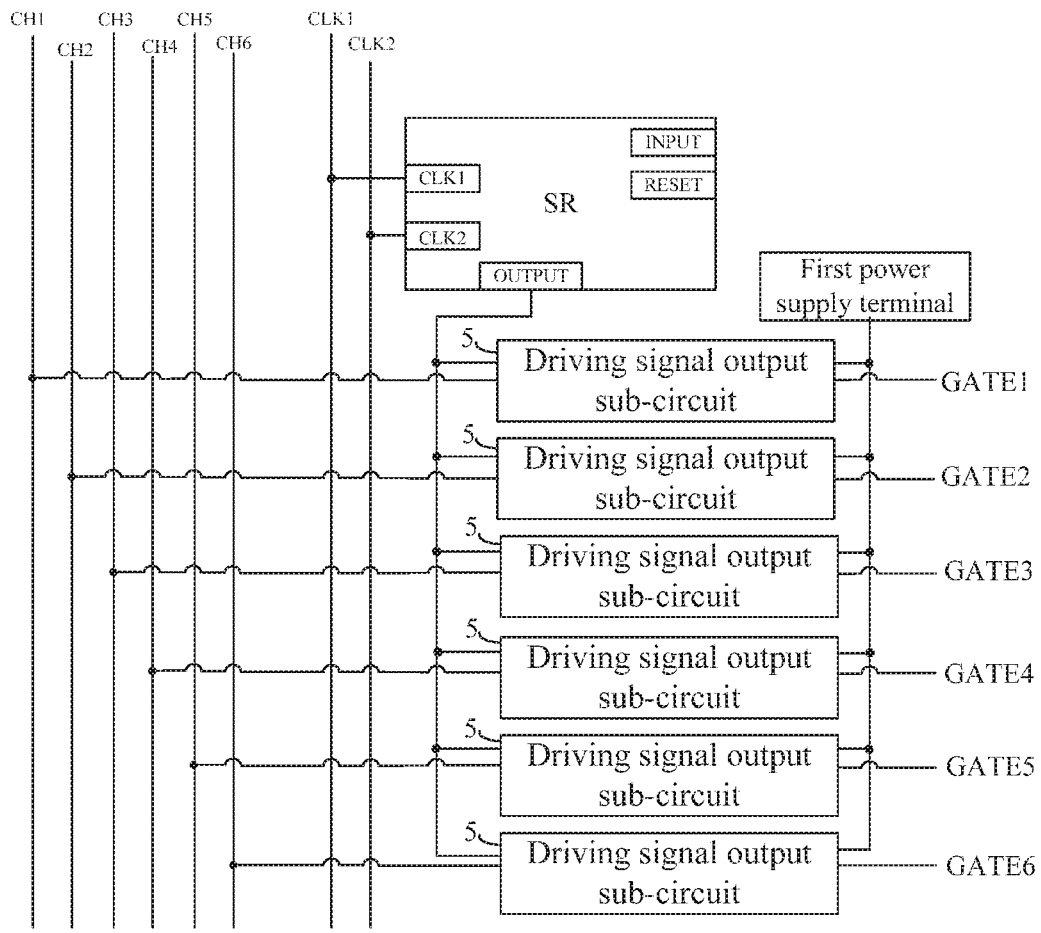
FIG. 1 is a schematic diagram illustrating a structure of a gate driving unit circuit according to an embodiment of the present disclosure.

FIG. 1 is a schematic diagram illustrating a structure of a gate driving unit circuit according to an embodiment of the present disclosure. As illustrated in FIG. 1, the gate driving unit circuit includes a shift register SR and a plurality of driving signal output sub-circuits 5. Each of the driving signal output sub-circuits 5 corresponds to one of a plurality of gate lines on an array substrate. Each of the driving signal output sub-circuits 5 is coupled to a first power supply terminal and a signal output terminal OUTPUT of the shift register SR and also coupled to a corresponding and different one of driving scan signal lines (for example, the driving scan signal lines CH1 to CH6 in FIG. 1), and time periods in which respective driving scan signals provided by the driving scan signal lines are of an ON voltage do not overlap with each other. Each of the driving signal output sub-circuits 5 is configured to output, under the control of a signal output by the signal output terminal OUTPUT of the shift register SR, a driving scan signal provided by the corresponding one of the driving scan signal lines or an OFF voltage provided by the first power supply terminal to the corresponding one of the gate lines.

FIG. 1 illustrates six driving signal output sub-circuits 5, six driving scan signal lines CH1 to CH6, and six gate lines GATE1 to GATE6, but the numbers of these elements are not limited thereto. The present disclosure is intended to show that a gate driving unit circuit including N driving signal output sub-circuits requires N driving scan signal lines, where N is generally smaller than the total number of gate lines of the array substrate. In one example, the number N of driving signal output sub-circuits (or the number of driving scan signal lines) may have such a value that the total number of gate lines of the array substrate is an integer multiple of N.

Different from the technical solution of the related art in which a signal output terminal of one shift register is directly coupled to a corresponding one of the gate lines and a signal output by the signal output terminal of the shift register is used as a driving signal of the corresponding gate line, in the present disclosure, the signal output terminal OUTPUT of one shift register SR is coupled to multiple driving signal output sub-circuits 5, and the signal output by the signal output terminal OUTPUT of the shift register SR is used as a control signal for controlling the driving signal output sub-circuits 5. Under the control of the control signal output by the signal output terminal OUTPUT of the shift register SR, each of the driving signal output sub-circuits 5 transmits the driving scan signal provided by the corresponding one of the driving scan signal lines CH1 to CH6 or the OFF voltage provided by the first power supply terminal to the corresponding one of the gate lines GATE1 to GATE6, so as to drive or reset the gate lines GATE1 to GATE6.

Specifically, when the signal output terminal OUTPUT of the shift register SR outputs an operating voltage such as an ON voltage (as a comparison, the voltage output by the shift register in the related art is used for directly driving the gate lines), each of the driving signal output sub-circuits 5 transmits, under the control of the operating voltage, the driving scan signal provided by the corresponding one of the driving scan signal lines CH1 to CH6 to the corresponding one of the gate lines GATE1 to GATE6, so as to drive the gate lines GATE1 to GATE6.

When the signal output terminal OUTPUT of the shift register SR outputs a non-operating voltage such as an OFF voltage, each of the driving signal output sub-circuits 5 transmits, under the control of the operating voltage, the OFF voltage provided by the first power supply terminal to the corresponding one of the gate lines GATE1 to GATE6, so as to reset the gate lines GATE1 to GATE6.

It can be seen that in the gate driving unit circuit according to the embodiments of the present disclosure, one shift register SR can drive the plurality of gate lines GATE1 to GATE6, so the number of shift registers in the gate driving circuit can be greatly reduced, thereby effectively reducing the occupied space of the gate driving circuit and facilitating the narrow bezel of the display panel.

In practical applications, each of the gate lines in the display panel extends in a row direction, and each of data lines extends in a column direction. In the embodiments of the present disclosure, all of the driving signal output sub-circuits 5 may be arranged in the column direction. In this case, the width of the gate driving unit circuit in the row direction can be greatly reduced, which is advantageous to further narrowing the bezel of the display panel.

In practical applications, when the number of gate lines in the display panel is constant, the larger the number (i.e., the number of gate lines that one gate driving unit circuit can drive) of driving signal output sub-circuits 5 in one gate driving unit circuit, the smaller the number (i.e., the number of gate driving unit circuits for driving all gate lines in the display panel) of gate driving unit circuits required in the gate driving circuit is, the smaller the number (i.e., the number of the shift registers SR for driving all gate lines in the display panel) of the shift registers SR in the gate driving circuit is, and accordingly, the smaller the size of the gate driving circuit is. However, in this case, the required number of driving scanning signal lines is correspondingly increased, the required processing capability for a control chip (not shown) used for inputting a driving scanning signal to each of the driving scanning signal lines becomes higher, and the cost required for the control chip is increased.

In view of the above factors, in some embodiments, the number of the driving signal output sub-circuits 5 in one gate driving unit circuit is 2 to 8. In one example, the number of the driving signal output sub-circuits 5 is six, and in this case, the cost of the control chip can be ensured to be not high while the size of the gate driving circuit is reduced.

Figure 2:
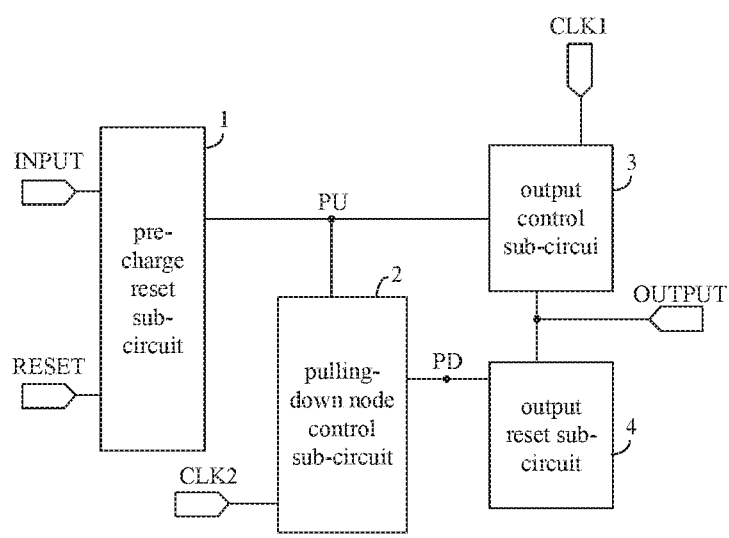
FIG. 2 is a schematic diagram illustrating a structure of a shift register according to an embodiment of the present disclosure.

FIG. 2 is a schematic diagram illustrating a structure of a shift register according to an embodiment of the present disclosure. As illustrated in FIG. 2, the shift register SR includes a pre-charge reset sub-circuit 1, a pulling-down node control sub-circuit 2, an output control sub-circuit 3 and an output reset sub-circuit 4. The pre-charge reset sub-circuit 1, the pulling-down node control sub-circuit 2 and the output control sub-circuit 3 are coupled to a pulling-up node PU, and the output control sub-circuit 3 and the output reset sub-circuit 4 are coupled to a pulling-down node PD.

The pre-charge reset sub-circuit 1 is configured to perform a pre-charge processing on the pulling-up node PU under the control of a pre-charge signal input by a pre-charge signal input terminal INPUT and a reset processing on the pulling-up node PU under the control of a reset signal input by a reset signal input terminal RESET.

The output control sub-circuit 3 is coupled to a first clock signal terminal CLK1, and configured to transmit a first clock signal provided by the first clock signal terminal CLK1 to the signal output terminal OUTPUT under the control of a voltage level at the pulling-up node PU.

The pulling-down node control sub-circuit 2 is coupled to a second clock signal terminal CLK2, and configured to transmit a second clock signal provided by the second clock signal terminal CLK2 to the pulling-down node PD under the control of the voltage level at the pulling-up node PU.

The output reset sub-circuit 4 is configured to reset the signal output terminal OUTPUT under the control of a voltage level at the pulling-down node PD.

The first clock signal and the second clock signal have a same period and a phase difference of a half of the period.

Figure 3:
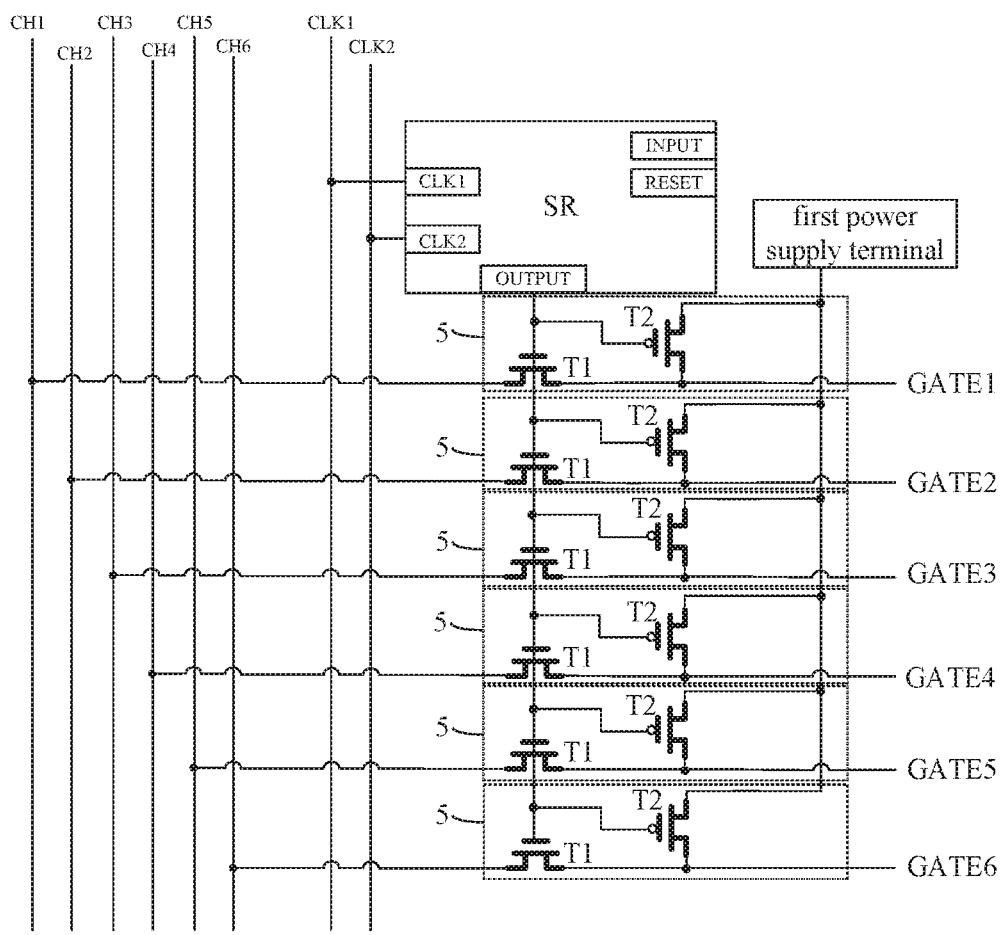
FIG. 3 is a schematic diagram illustrating a structure of a gate driving unit circuit according to an embodiment of the present disclosure.

FIG. 3 is a schematic diagram illustrating a structure of a gate driving unit circuit according to an embodiment of the present disclosure, which illustrates a specific implementation of the driving signal output sub-circuit 5 of the gate driving unit circuit illustrated in FIG. 2. In some embodiments, the driving signal output sub-circuit 5 includes a first transistor T1 and a second transistor T2. A control electrode of the first transistor T1 is coupled to the signal output terminal OUTPUT of the shift register SR, a first electrode of the first transistor T1 is coupled to the corresponding one of the driving scan signal lines CH1 to CH6, and a second electrode of the first transistor T1 is coupled to the corresponding one of the gate lines. A control electrode of the second transistor T2 is coupled to the signal output terminal OUTPUT of the shift register SR, a first electrode of the second transistor T2 is coupled to the first power supply terminal, and a second electrode of the second transistor T2 is coupled to the corresponding one of the gate lines.

Hereinafter, the exemplary description is given by taking a case where the number of the driving signal output sub-circuits 5 is six, the number of the driving scanning signal lines CH1 to CH6 is six, the first transistor T1 is an N-type transistor, the second transistor T2 is a P-type transistor, the operating voltage output by the signal output terminal OUTPUT is a high level voltage, and the non-operating voltage is a low level voltage, as an example.

Figure 4:
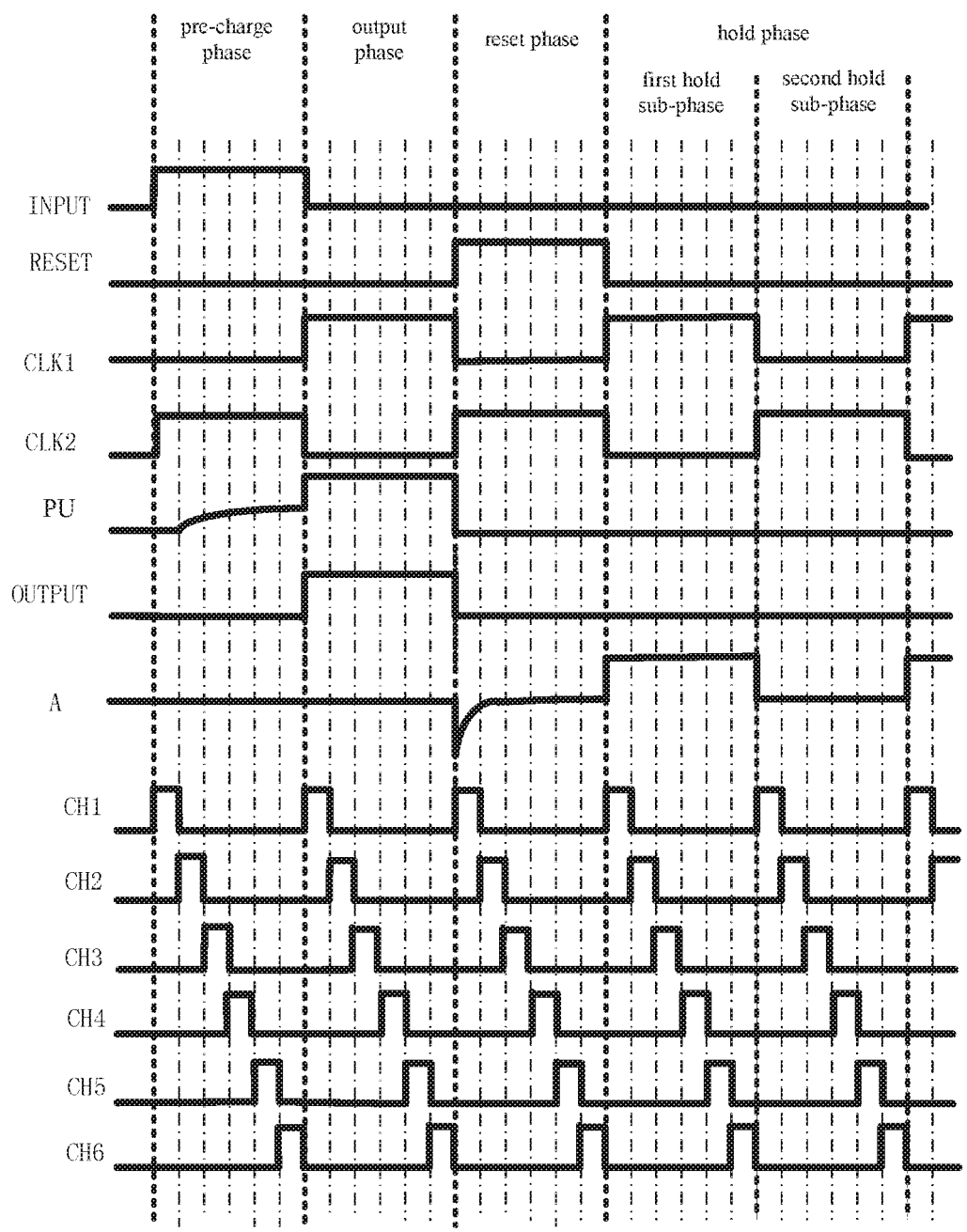
FIG. 4 is an operation timing diagram of a gate driving unit circuit according to an embodiment of the present disclosure.

FIG. 4 is an operation timing diagram of a gate driving unit circuit according to an embodiment of the present disclosure. As illustrated in FIG. 4, an operating process (i.e., one period) of the gate driving unit circuit includes four phases: a pre-charge phase, an output phase, a reset phase, and a hold phase.

In the pre-charge phase, the pre-charge reset sub-circuit 1 of the shift register SR performs a pre-charge processing on the pulling-up node PU under the control of the pre-charge signal input by the pre-charge signal input terminal INPUT, and a voltage level at the pulling-up node PU is pulled up. The output control sub-circuit 3 transmits the first clock signal provided by the first clock signal terminal CLK1 to the signal output terminal OUTPUT under the control of the voltage level at the pulling-up node PU. Since the first clock signal is at a low level, the signal output terminal OUTPUT of the shift register SR outputs a low level.

In each of the driving signal output sub-circuits 5, since the signal output terminal OUTPUT of the shift register SR outputs the low level, the first transistor T1 is turned off, the second transistor T2 is turned on, and the OFF voltage provided by the first power supply terminal is transmitted to the gate lines GATE1 to GATE6 via the second transistors T2.

In the output phase, the first clock signal provided by the first clock signal terminal CLK1 transits to a high level, and the signal output terminal OUTPUT of the shift register SR outputs a high level. During this process, the voltage of the pulling-up node PU is further pulled up.

In each of the driving signal output sub-circuits 5, since the signal output terminal OUTPUT of the shift register SR outputs the high level, the first transistor T1 is turned on, the second transistor T2 is turned off, and the driving scan signals provided by the driving scan signal lines CH1 to CH6 are transmitted to corresponding gate lines GATE1 to GATE6 via the first transistor T1.

Since the time periods in which respective driving scan signals provided by the driving scan signal lines CH1 to CH6 are of a driving voltage (that is, a high level voltage) do not overlap with each other, the driving signal output sub-circuits 5 transmit, one by one, the driving voltage to corresponding ones of gate lines GATE1 to GATE6, so as to sequentially drive the gate lines GATE1 to GATE6 one by one.

Taking the case shown in FIG. 4 as an example, the entire output phase is divided into six sub-phases. In the first sub-phase, the driving signal output sub-circuit 5 coupled to the driving scan signal line CH1 transmits the driving voltage to the corresponding first gate line GATE 1. In the second sub-phase, the driving signal output sub-circuit 5 coupled to the driving scan signal line CH2 transmits the driving voltage to the corresponding second gate line GATE2, and so on and so forth, until the driving of the sixth gate line GATE6 is completed.

It should be noted that after the driving of the gate lines GATE1 to GATE6 is completed, since the driving scan signals provided by the driving scan signal lines CH1 to CH6 become low level, the voltages of the gate lines GATE1 to GATE6 also become low level. That is, at the end of the output phase, the voltage of each of the gate lines GATE1 to GATE6 is the OFF voltage.

In the reset phase, the pre-charge reset sub-circuit 1 performs a reset processing on the pulling-up node PU under the control of the reset signal input by the reset signal input terminal RESET. The pulling-down node control sub-circuit 2 transmits the second clock signal provided by the second clock signal terminal CLK2 to the pulling-down node PD under the control of the voltage level at the pulling-up node PU. At this time, since the second clock signal is of a high level, the pulling-down node PD is at a high level, and the output reset sub-circuit 4 resets the signal output terminal OUTPUT under the control of the voltage level at the pulling-down node PD. At this time, the signal output terminal OUTPUT of the shift register SR outputs a low level.

In each of the driving signal output sub-circuits 5, since the signal output terminal OUTPUT of the shift register SR outputs the low level, the first transistor T1 is turned off, the second transistor T2 is turned on, and the OFF voltage provided by the first power supply terminal is transmitted to the gate lines GATE1 to GATE6 via the second transistor T2 to reset the gate lines GATE1 to GATE6.

In the hold phase, since the voltage level at the pulling-up node PU is kept low, the signal output terminal OUTPUT of the shift register SR outputs a low level, and the first transistor T1 in each of the driving signal output sub-circuits 5 maintains off, the second transistor T2 maintains on, and the OFF voltage maintains to be transmitted to the gate lines GATE1 to GATE6 via the second transistor T2, to maintain the voltages of the gate lines GATE1 to GATE6 to be the OFF voltage.

It should be understood by those skilled in the art that in the present embodiment, in a case where the transistors in the pixel units to which the gate lines GATE1 to GATE6 are coupled are P-type transistors, the first transistor T1 is a P-type transistor, and the second transistor T2 is an N-type transistor, the details of which will not be described here.

It can be seen from the above that in the technical solution of the present disclosure, multiple gate lines can be driving by using one shift register, so the number of shift registers in the gate driving circuit can be greatly reduced, thereby effectively reducing the occupied space of the gate driving circuit and facilitating the narrow bezel of the display panel.

Figure 5:
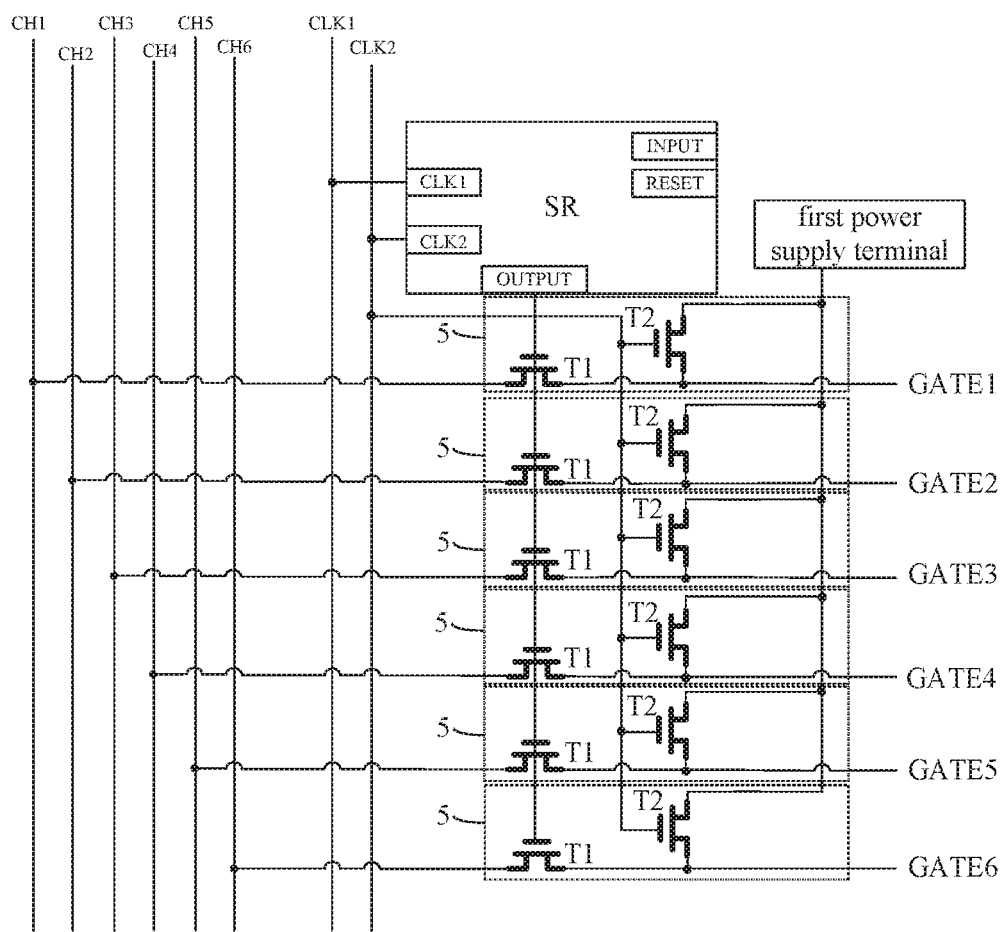
FIG. 5 is a schematic diagram illustrating a structure of a gate driving unit circuit according to an embodiment of the present disclosure.

FIG. 5 is a schematic diagram illustrating a structure of a gate driving unit circuit according to an embodiment of the present disclosure. Different from the structure illustrated in FIG. 3 in which the control electrodes of the first and second transistors T1 and T2 of the driving signal output sub-circuit 5 are both coupled to the signal output terminal OUTPUT of the shift register SR, in the driving signal output sub-circuit 5 illustrated in FIG. 5, the control electrode of the first transistor T1 is coupled to the signal output terminal OUTPUT of the shift register SR, and the control electrode of the second transistor T2 is coupled to the second clock signal terminal CLK2.

In the circuit shown in FIG. 5, the first transistor T1 and the second transistor T2 are both N-type transistors, or are both P-type transistors.

The following description will be made by taking an example in which the first transistor T1 and the second transistor T2 are both N-type transistors. The operation timing diagram of the gate driving unit circuit illustrated in FIG. 5 maybe the one of FIG. 4, and for the working process of the shift register SR in each phase, it may refer to the corresponding content described above with reference to FIG. 4, details of which are not described herein. Hereinafter, only the operation of each driving signal output sub-circuit 5 will be described in detail.

In the pre-charge phase, the signal output terminal OUTPUT of the shift register SR outputs a low level, and the second clock signal provided by the second clock signal terminal CLK2 is of a high level.

In each of the driving signal output sub-circuits 5, since the signal output terminal OUTPUT of the shift register SR outputs the low level, the first transistor T1 is turned off, and since the second clock signal is of a high level, the second transistor T2 is turned on. At this time, the OFF voltage provided by the first power supply terminal is transmitted to the gate lines GATE1 to GATE6 via the second transistor T2.

In the output phase, the signal output terminal OUTPUT of the shift register SR outputs a high level, and the second clock signal provided by the second clock signal terminal CLK2 is of a low level.

In each of the driving signal output sub-circuits 5, since the signal output terminal OUTPUT of the shift register SR outputs the high level, the first transistor T1 is turned on, and since the second clock signal is of a low level, the second transistor T2 is turned off. At this time, each of the driving signal output sub-circuits 5 transmits a driving scan signal to the corresponding one of the gate lines GATE1 to GATE6. Since the time periods in which respective driving scan signals provided by the driving scan signal lines CH1 to CH6 are of a driving voltage (that is, a high level voltage) do not overlap with each other, the driving signal output sub-circuits 5 transmit, one by one, the driving voltage to corresponding ones of gate lines GATE1 to GATE6, so as to sequentially drive the gate lines GATE1 to GATE6 one by one.

It should be noted that after the driving of the gate lines GATE1 to GATE6 is completed, since the driving scan signals provided by the driving scan signal lines CH1 to CH6 become low level, the voltages of the gate lines GATE1 to GATE6 also become low level. That is, at the end of the output phase, the voltage of each of the gate lines GATE1 to GATE6 is the OFF voltage.

In the output phase, the signal output terminal OUTPUT of the shift register SR outputs a low level, and the second clock signal provided by the second clock signal terminal CLK2 is of a high level.

In each of the driving signal output sub-circuits 5, since the signal output terminal OUTPUT of the shift register SR outputs the low level, the first transistor T1 is turned off, and since the second clock signal is of a high level, the second transistor T2 is turned on. At this time, the OFF voltage provided by the first power supply terminal is transmitted to the gate lines GATE1 to GATE6 via the second transistor T2 to reset the gate lines GATE1 to GATE6.

The hold phase includes a first hold sub-phase and a second hold sub-phase which are alternate.

In the first hold sub-phase, the signal output terminal OUTPUT of the shift register SR outputs a low level, and the second clock signal provided by the second clock signal terminal CLK2 is of a low level.

In each of the driving signal output sub-circuits 5, since the signal output terminal OUTPUT of the shift register SR outputs the low level, the first transistor T1 is turned off, and since the second clock signal is of a low level, the second transistor T2 is turned off. At this time, the gate lines GATE1 to GATE6 are floating, and the voltages of the gate lines GATE1 to GATE6 maintain the OFF voltage in the previous phase.

In the second hold sub-phase, the signal output terminal OUTPUT of the shift register SR outputs a low level, and the second clock signal provided by the second clock signal terminal CLK2 is of a high level.

In each of the driving signal output sub-circuits 5, since the signal output terminal OUTPUT of the shift register SR outputs the low level, the first transistor T1 is turned off, and since the second clock signal is of a high level, the second transistor T2 is turned on. At this time, the OFF voltage provided by the first power supply terminal is transmitted to the gate lines GATE1 to GATE6 via the second transistor T2 to maintain the voltages of the gate lines GATE1 to GATE6 to be the OFF voltage.

It should be noted that during the first hold sub-phase, since the gate lines GATE1 to GATE6 are floating, the voltages of the gate lines GATE1 to GATE6 are liable to be offset. By writing the OFF voltage provided by the first power supply terminal to the gate lines GATE1 to GATE6 in the second hold sub-phase, the offset of the OFF voltage on the gate lines GATE1 to GATE6 can be corrected in time.

In the entire hold phase, the first hold sub-phase and the second hold sub-phase occur alternately, thereby effectively maintaining the voltages of the gate lines GATE1 to GATE6 to be the OFF voltage.

Figure 6:
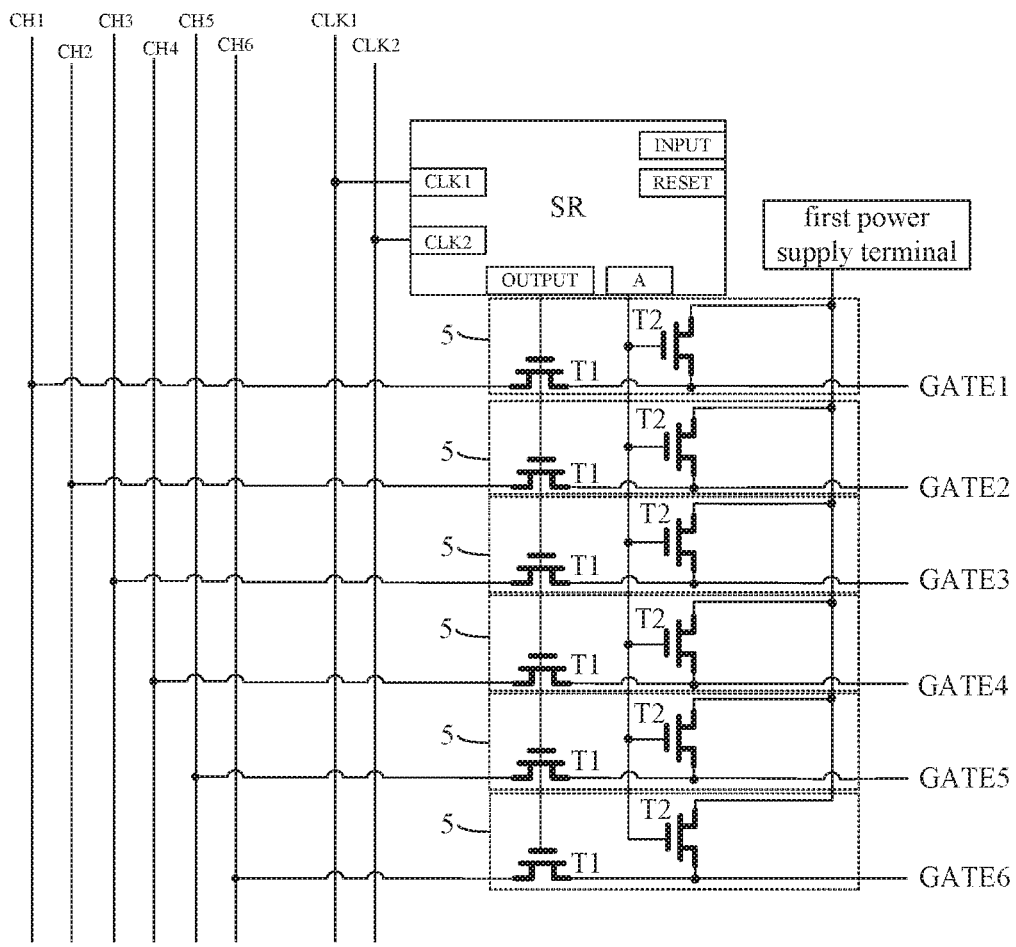
FIG. 6 is a schematic diagram illustrating a structure of a gate driving unit circuit according to an embodiment of the present disclosure.
Figure 7:
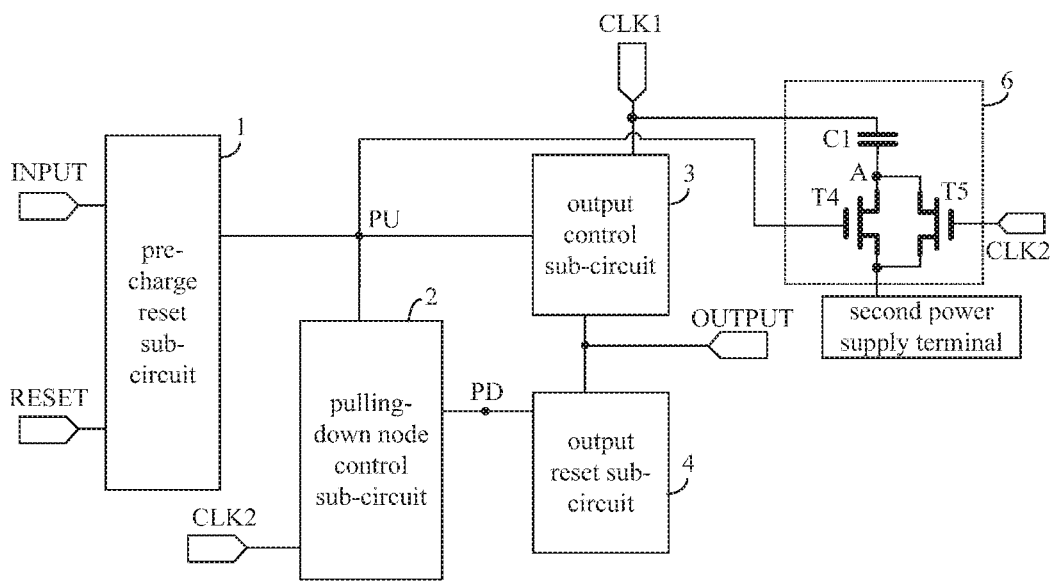
FIG. 7 is a schematic diagram illustrating a structure of the shift register and the voltage synchronization sub-circuit in FIG. 6.

FIG. 6 is a schematic diagram illustrating a structure of a gate driving unit circuit according to an embodiment of the present disclosure, and FIG. 7 is a schematic diagram illustrating a structure of the shift register SR and a voltage synchronization sub-circuit 6 in FIG. 6. As illustrated in FIGS. 6 and 7, different from the gate driving unit circuit described with reference to FIGS. 1-3 and 5, the gate driving unit circuit according to an embodiment of the present disclosure further includes the voltage synchronization sub-circuit 6. The voltage synchronization sub-circuit 6 includes a fourth transistor T4 and a first capacitor C1. A control electrode of the fourth transistor T4 is coupled to the pulling-up node PU, a first electrode of the fourth transistor T4 is coupled to a second power supply terminal, and a second electrode of the fourth transistor is coupled to a first end of the first capacitor C1 at a voltage synchronization node A. A second end of the first capacitor C1 is coupled to the first clock signal terminal CLK1.

In the circuits shown in FIGS. 6 and 7, the second power supply terminal provides a low level voltage Vgl.

In this case, the driving signal output sub-circuit 5 includes the first transistor T1 and the second transistor T2. A control electrode of the first transistor T1 is coupled to the signal output terminal OUTPUT of the shift register SR, a first electrode of the first transistor T1 is coupled to the corresponding one of the driving scan signal lines CH1 to CH6, and a second electrode of the first transistor T1 is coupled to the corresponding one of the gate lines GATE1 to GATE6. A control electrode of the second transistor T2 is coupled to the voltage synchronization node A, a first electrode of the second transistor T2 is coupled to the first power supply terminal, and a second electrode of the second transistor T2 is coupled to the corresponding one of the gate lines GATE1 to GATE6.

In the circuits shown in FIGS. 6 and 7, the first transistor T1 and the second transistor T2 are both N-type transistors, or are both P-type transistors.

The following description will be made by taking an example in which the first, second and fourth transistors T1, T2 and T4 are all N-type transistors. The operation timing diagram of the gate driving unit circuit illustrated in FIG. 6 may be the one of FIG. 4, and for the working process of the shift register SR in each phase, it may refer to the corresponding content described above with reference to FIG. 4, details of which are not described herein. Hereinafter, only the operation of each driving signal output sub-circuit 5 will be described in detail.

In the pre-charge phase, the signal output terminal OUTPUT of the shift register SR outputs a low level. At the same time, since the voltage level at the pulling-up node PU is high, the fourth transistor is turned on, and the low-level voltage provided by the second power supply terminal is written into the voltage synchronization node A, that is, the voltage level at the voltage synchronization node A is low.

In each of the driving signal output sub-circuits 5, since the signal output terminal OUTPUT of the shift register SR outputs the low level, the first transistor T1 is turned off, and since the voltage level at the voltage synchronization node A is low, the second transistor T2 is turned off. At this time, the gate lines GATE1 to GATE6 are floating, and the voltages of the gate lines GATE1 to GATE6 maintain the OFF voltage in the previous phase.

In the output phase, the signal output terminal OUTPUT of the shift register SR outputs a high level. At the same time, since the voltage at the pulling-up node PU is at a high level, the fourth transistor maintains on, and the voltage level at the voltage synchronization node A maintains low.

In each of the driving signal output sub-circuits 5, since the signal output terminal OUTPUT of the shift register SR outputs the high level, the first transistor T1 is turned on, and since the voltage level at the voltage synchronization node A is low, the second transistor T2 is turned off. At this time, each of the driving signal output sub-circuits 5 transmits a driving scan signal to the corresponding one of the gate lines GATE1 to GATE6. Since the time periods in which respective driving scan signals provided by the driving scan signal lines CH1 to CH6 are of a driving voltage (that is, a high level voltage) do not overlap with each other, the driving signal output sub-circuits 5 transmit, one by one, the driving voltage to corresponding ones of gate lines GATE1 to GATE6, so as to sequentially drive the gate lines GATE1 to GATE6 one by one.

It should be noted that after the driving of the gate lines GATE1 to GATE6 is completed, since the driving scan signals provided by the driving scan signal lines CH1 to CH6 become low level, the voltages of the gate lines GATE1 to GATE6 also become low level. That is, at the end of the output phase, the voltage of each of the gate lines GATE1 to GATE6 is the OFF voltage.

In addition, at the end of the output phase, the first end of the first capacitor C1 is at a low level, and the second end of the first capacitor C1 is at a high level (because the first clock signal is of a high level).

In the reset phase, the signal output terminal OUTPUT of the shift register SR outputs a low level. At the same time, since the voltage level at the pulling-up node PU is low, the fourth transistor is turned off, and at this time, the voltage synchronization node A is floating.

It should be noted that, when transiting from the output phase to the reset phase, since the first clock signal transits from a high level to a low level, the voltage level at the voltage synchronization node A instantaneously jumps from a low level to a lower level due to the bootstrapping effect of the capacitor. However, since the gate voltage (i.e., the voltage at the pulling-up node PU) of the fourth transistor is much larger than the drain voltage (i.e., the voltage at the voltage synchronization node A) of the fourth transistor, the fourth transistor is turned on again, and the voltage synchronization node A is charged through the second power supply terminal until the voltage at the voltage synchronization node A is equal to a difference between the voltage at the pulling-up node PU and the threshold voltage of the fourth transistor. At this time, the voltage at the voltage synchronization node A is approximately Vgl, that is, the voltage level at the voltage synchronization node A is low.

In the embodiments of the present disclosure, to avoid the problem that the voltage level at the voltage synchronization node A cannot raise to a low level from a lower level due to the too-short reset phase (that is, the time for charging the voltage synchronization node A via the fourth transistor through the second power supply terminal is too short to enable the voltage of the voltage synchronization node A to reach Vgl), as illustrated in FIG. 7, the voltage synchronization sub-circuit 6 further includes a fifth transistor T5. A control electrode of the fifth transistor T5 is coupled to the second clock signal terminal CLK2, a first electrode of the fifth transistor T5 is coupled to the second power supply terminal, and a second electrode of the fifth transistor T5 is coupled to the voltage synchronization node A.

Since the second clock signal provided by the second clock signal terminal CLK2 is at a high level during the reset phase, the fifth transistor T5 is turned on, and the voltage synchronization node A is coupled to the second power supply terminal, thereby ensuring that the voltage synchronization node A maintains at Vgl during the reset phase.

In each of the driving signal output sub-circuits 5, since the signal output terminal OUTPUT of the shift register SR outputs the low level, the first transistor T1 is turned off, and since the voltage level at the voltage synchronization node A is low, the second transistor T2 is turned off. At this time, the gate lines GATE1 to GATE6 are floating, and the voltages of the gate lines GATE1 to GATE6 maintain the OFF voltage in the previous phase.

It should be noted that, at the end of the reset phase, the first end of the first capacitor C1 is at a low level, and the second end of the first capacitor C1 is at a low level (because of the low level of the first clock signal).

The hold phase includes a first hold sub-phase and a second hold sub-phase which are alternate.

In the first hold sub-phase, the signal output terminal OUTPUT of the shift register SR outputs a low level. At the same time, since the first clock signal provided by the first clock signal terminal CLK1 transits from a low level to a high level, the voltage level at the second end of the first capacitor C1 jumps from a low level to a high level, and since the fourth transistor is turned off, the first end of the first capacitor C1 is floating, and the voltage level at the first end of the first capacitor C1 jumps from a low level to a high level due to the bootstrapping effect of the first capacitor C1, that is, the voltage level at the voltage synchronization node A is high.

In each of the driving signal output sub-circuits 5, since the signal output terminal OUTPUT of the shift register SR outputs the low level, the first transistor T1 is turned off, and since the voltage level at the voltage synchronization node A is high, the second transistor T2 is turned on, and the OFF voltage provided by the first power supply terminal is transmitted to the gate lines GATE1 to GATE6 via the second transistor T2 to maintain the OFF voltage of the gate lines GATE1 to GATE6.

In the second hold sub-phase, the signal output terminal OUTPUT of the shift register SR outputs a low level. At the same time, since the first clock signal provided by the first clock signal terminal CLK1 transits from a high level to a low level, the voltage level at the second end of the first capacitor C1 jumps from a high level to a low level, and since the fourth transistor is turned off, the first end of the first capacitor C1 is floating, and the voltage level at the first end of the first capacitor C1 jumps from a high level to a low level due to the bootstrapping effect of the first capacitor C1, that is, the voltage level at the voltage synchronization node A is low.

In each of the driving signal output sub-circuits 5, since the signal output terminal OUTPUT of the shift register SR outputs the low level, the first transistor T1 is turned off, and since the voltage level at the voltage synchronization node A is low, the second transistor T2 is turned off. At this time, the gate lines GATE1 to GATE6 are floating, and the voltages of the gate lines GATE1 to GATE6 maintain the OFF voltage in the previous phase.

It should be noted that during the second hold sub-phase, since the gate lines GATE1 to GATE6 are floating, the voltages of the gate lines GATE1 to GATE6 are liable to be offset. By writing the OFF voltage provided by the first power supply terminal to the gate lines GATE1 to GATE6 during the first hold sub-phase, the offset of the OFF voltage on the gate lines GATE1 to GATE6 can be corrected in time.

Figure 8:
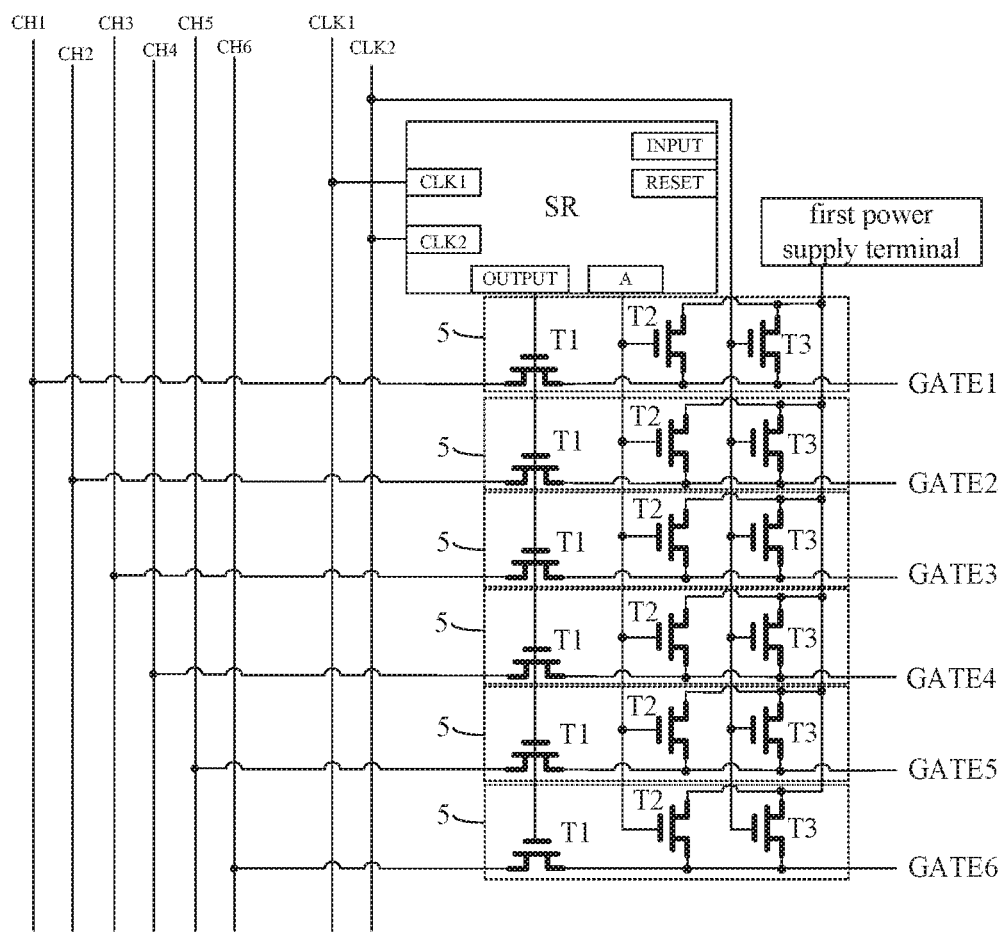
FIG. 8 is a schematic diagram illustrating a structure of a gate driving unit circuit according to an embodiment of the present disclosure.
Figure 9:
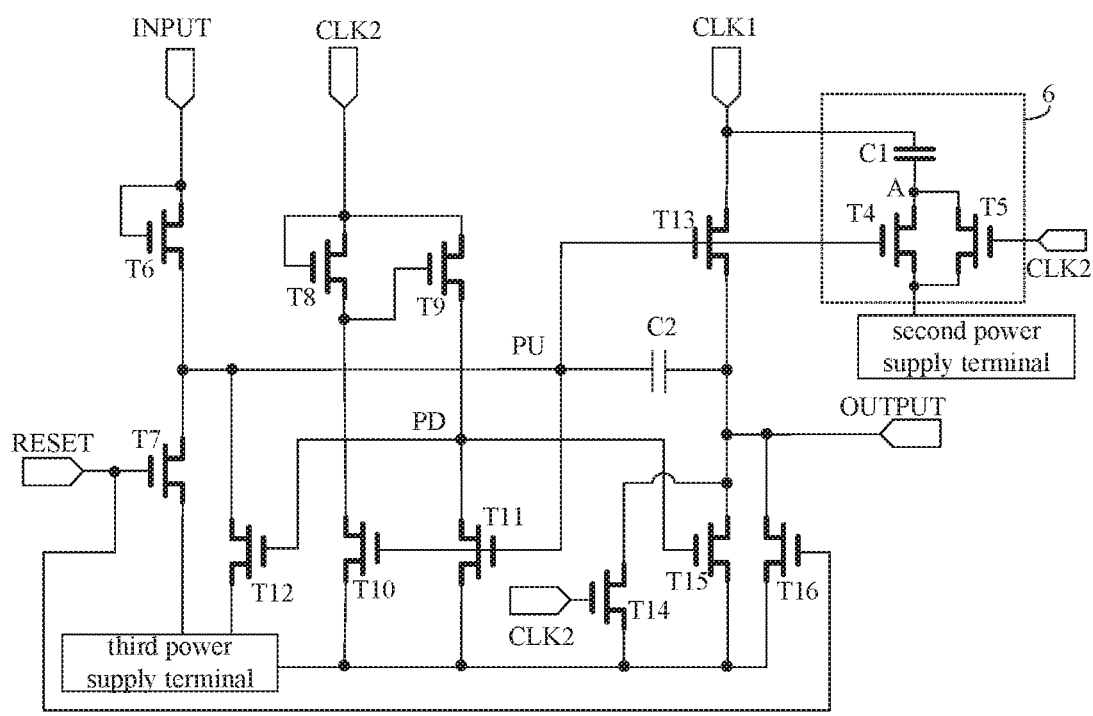
FIG. 9 is a schematic diagram illustrating a structure of the shift register and the voltage synchronization sub-circuit in FIG. 8.

FIG. 8 is a schematic diagram illustrating a structure of a gate driving unit circuit according to an embodiment of the present disclosure, and FIG. 9 is a schematic diagram illustrating a structure of the shift register and the voltage synchronization sub-circuit in FIG. 8. The circuits illustrated in FIGS. 8 and 9 are modifications of the circuits illustrated in FIGS. 6 and 7. Specifically, as illustrated in FIG. 8, the driving signal output sub-circuit 5 includes not only the first and second transistors T1 and T2 in FIG. 6, but also a third transistor T3.

A control electrode of the third transistor T3 is coupled to the second clock signal terminal CLK2, a first electrode of the third transistor T3 is coupled to the first power supply terminal, and a second electrode of the third transistor T3 is coupled to the corresponding one of the gate lines GATE1 to GATE6.

Further, FIG. 9 illustrates a specific structure of the shift register SR according to an embodiment of the present disclosure. The pre-charge reset sub-circuit 1 may include a sixth transistor T6 and a seventh transistor T7. A control electrode and a first electrode of the sixth transistor T6 are both coupled to the pre-charge signal input terminal INPUT, and a second electrode of the sixth transistor T6 is coupled to the pulling-up node PU. A control electrode of the seventh transistor T7 is coupled to the reset signal input terminal RESET, a first electrode of the seventh transistor T7 is coupled to the pulling-up node PU, and a second electrode of the seventh transistor T7 is coupled to a third power supply terminal.

The pulling-down node control sub-circuit 2 may include an eighth transistor T8, a ninth transistor T9, a tenth transistor T10, an eleventh transistor T11, and a twelfth transistor T12. A control electrode and a first electrode of the eighth transistor T8 are both coupled to the second clock signal terminal CLK2, and a second electrode of the eighth transistor T8 is coupled to both a control electrode of the ninth transistor T9 and a first electrode of the tenth transistor T10. A first electrode of the ninth transistor T9 is coupled to the second clock signal terminal CLK2, and a second electrode of the ninth transistor T9 is coupled to the pulling-down node PD. A control electrode of the tenth transistor T10 is coupled to the pulling-up node PU, and a second electrode of the tenth transistor T10 is coupled to the third power supply terminal. A control electrode of the eleventh transistor T11 is coupled to the pulling-up node PU, a first electrode of the eleventh transistor T11 is coupled to the pulling-down node PD, and a second electrode of the eleventh transistor T11 is coupled to the third power supply terminal. A control electrode of the twelfth transistor T12 is coupled to the pulling-down node PD, a first electrode of the twelfth transistor T12 is coupled to the pulling-up node PU, and a second electrode of the twelfth transistor T12 is coupled to the third power supply terminal. The third power supply terminal may be configured to provide a low-level voltage Vss.

The output control sub-circuit 3 may include a second capacitor C2 and a thirteenth transistor T13. A first end of the second capacitor C2 is coupled to the pulling-up node PU, and a second end of the second capacitor C2 is coupled to the signal output terminal OUTPUT and a second electrode of the thirteenth transistor T13. A control electrode of the thirteenth transistor T13 is coupled to the pulling-up node PU, a first electrode of the thirteenth transistor T13 is coupled to the first clock signal terminal CLK1, and the second electrode of the thirteenth transistor T13 is coupled to the signal output terminal OUTPUT.

The output reset sub-circuit 4 may include a fourteenth transistor T14, a fifteenth transistor T15, and a sixteenth transistor T16. A control electrode of the fourteenth transistor T14 is coupled to the second clock signal terminal CLK2, a first electrode of the fourteenth transistor T14 is coupled to the signal output terminal OUTPUT, and a second electrode of the fourteenth transistor T14 is coupled to the third power supply terminal. A control electrode of the fifteenth transistor T15 is coupled to the pulling-down node PD, a first electrode of the fifteenth transistor T15 is coupled to the signal output terminal OUTPUT, and a second electrode of the fifteenth transistor T15 is coupled to the third power supply terminal. A control electrode of the sixteenth transistor T16 is coupled to the reset signal input terminal RESET, a first electrode of the sixteenth transistor T16 is coupled to the signal output terminal OUTPUT, and a second electrode of the sixteenth transistor T16 is coupled to the third power supply terminal.

Hereinafter, the operating process of the gate driving unit circuit illustrated in FIGS. 8 and 9 is descried in detail by taking an example in which all transistors (i.e., the first to sixteenth transistors T1-T16) of the gate driving unit circuit are N-type transistors, and the operation timing thereof may be referred to FIG. 4.

It should be noted that the case where each transistor in the above-mentioned gate driving unit circuit is an N-type transistor is a preferred embodiment in the present disclosure. In this case, the first to sixteenth transistors T1-T16 can be fabricated at the same time by the same thin film transistor process.

The operating process of the gate driving unit circuit includes four phases: a pre-charge phase, an output phase, a reset phase, and a hold phase.

In the pre-charge phase, the pre-charge signal provided by the pre-charge signal input terminal INPUT is of a high level, and the reset signal provided by the reset signal input terminal RESET is of a low level. Thus, the sixth transistor T6 is turned on, the seventh transistor T7 is turned off, the pulling-up node PU is pre-charged via the sixth transistor T6 by the pre-charge signal, and the voltage level at the pulling-up node PU is pulled high.

Since the voltage level at the pulling-up node PU is high, the eleventh transistor T11 is turned on, the pulling-down node PD is charged via the eleventh transistor T11 through the third power supply terminal, and the voltage of the pulling-down node PD is Vss. Since the voltage level at the pulling-down node PD is low, the twelfth transistor T12, the fourteenth transistor T14, the fifteenth transistor T15, and the sixteenth transistor T16 are all turned off.

At the same time, since the voltage level at the pulling-up node PU is high, the thirteenth transistor T13 is turned on, and the first clock signal terminal CLK1 provides the first clock signal to the signal output terminal OUTPUT through the thirteenth transistor T13. Furthermore, since the first clock signal is of a low level, the signal output terminal OUTPUT outputs a low level.

In addition, since the voltage level at the pulling-up node PU is high, the fourth transistor is turned on, and the low-level voltage provided by the second power supply terminal is written into the voltage synchronization node A, that is, the voltage level at the voltage synchronization node A is low.

In each of the driving signal output sub-circuits 5, since the signal output terminal OUTPUT of the shift register SR outputs the low level, the first transistor T1 is turned off, and since the voltage level at the voltage synchronization node A is low, the second transistor T2 is turned off. At the same time, the second clock signal provided by the second clock signal terminal CLK2 is of a high level, and thus the third transistor T3 is turned on.

Since the third transistor T3 is turned on, the OFF voltage provided by the first power supply terminal is applied to the gate lines GATE1 to GATE6 via the third transistor T3.

In the output phase, the pre-charge signal provided by the pre-charge signal input terminal INPUT is of a low level, and the reset signal provided by the reset signal input terminal RESET is of a low level. Thus, the sixth transistor T6 and the seventh transistor T7 are both turned off, and the pulling-up node PU is floating.

The first clock signal terminal CLK1 keeps providing the first clock signal to the signal output terminal OUTPUT via the thirteenth transistor T13. However, since the first clock signal transits from a low level to a high level, the signal output terminal OUTPUT outputs a high level.

It should be noted that, since the pulling-up node PU is floating, the voltage level at the pulling-up node PU will raise to a higher level due to the bootstrapping effect of the second capacitor C2.

In addition, since the fourth transistor maintains on, the voltage level at the voltage synchronization node A maintains low.

In each of the driving signal output sub-circuits 5, since the signal output terminal OUTPUT of the shift register SR outputs the high level, the first transistor T1 is turned on, and since the voltage level at the voltage synchronization node A is low, the second transistor T2 is turned off. At the same time, the second clock signal provided by the second clock signal terminal CLK2 is of a low level, and thus the third transistor T3 is turned off.

At this time, each of the driving signal output sub-circuits 5 transmits a driving scan signal to the corresponding one of the gate lines GATE1 to GATE6. Since the time periods in which respective driving scan signals provided by the driving scan signal lines CH1 to CH6 are of a driving voltage (that is, a high level voltage) do not overlap with each other, the driving signal output sub-circuits 5 transmit, one by one, the driving voltage to corresponding ones of gate lines GATE1 to GATE6, so as to sequentially drive the gate lines GATE1 to GATE6 one by one.

It should be noted that after the driving of the gate lines GATE1 to GATE6 is completed, since the driving scan signals provided by the driving scan signal lines CH1 to CH6 become low level, the voltages of the gate lines GATE1 to GATE6 also become low level. That is, at the end of the output phase, the voltage of each of the gate lines GATE1 to GATE6 is the OFF voltage.

In addition, at the end of the output phase, the first end of the first capacitor C1 is at a low level, and the second end of the first capacitor C1 is at a high level (because the first clock signal is of a high level).

In the reset phase, the pre-charge signal provided by the pre-charge signal input terminal INPUT is of a low level, and the reset signal provided by the reset signal input terminal RESET is of a high level. Thus, the sixth transistor T6 is turned off, and the seventh transistor T7 is turned on.

The low-level voltage Vss provided by the third power supply terminal is written into the pulling-up node PU, and the voltage level at the pulling-up node PU is low. At this time, the fourth transistor T4, the tenth transistor T10, the eleventh transistor T11, and the thirteenth transistors T13 are all turned off.

Since the second clock signal provided by the second clock signal terminal CLK2 is of a high level, the eighth transistor T8 is turned on. Accordingly, the ninth transistor T9 is also turned on. The pulling-down node PD is charged via the ninth transistor T9 by the second clock signal, and the voltage level at the pulling-down node PD becomes a high level. At this time, the fifteenth transistor T15 is turned on, and the low-level voltage Vss provided by the third power supply terminal is written to the signal output terminal OUTPUT through the fifteenth transistor T15, and the signal output terminal OUTPUT outputs the low level.

It should be noted that, under the control of the pulling-down node PD, the twelfth transistor T12 is turned on, and noise reduction can be performed on the pulling-up node PU through the twelfth transistor T12. The fourteenth transistor T14 is turned on under the control of the second clock signal, the sixteenth transistor T16 is turned on under the control of the reset signal, and noise reduction can be performed on the signal output terminal OUTPUT through the fourteenth transistor T14 and the sixteenth transistor T16.

At the same time, since the second clock signal is of a high level, the fifth transistor T5 is turned on, the voltage synchronization node A is charged through the second power supply terminal, and the voltage level at the voltage synchronization node A is low.

In each of the driving signal output sub-circuits 5, since the signal output terminal OUTPUT of the shift register SR outputs the low level, the first transistor T1 is turned off, and since the voltage level at the voltage synchronization node A is low, the second transistor T2 is turned off. At the same time, the second clock signal is of a high level, and thus the third transistor T3 is turned on.

Since the third transistor T3 is turned on, the OFF voltage provided by the first power supply terminal is transmitted to the gate lines GATE1 to GATE6 via the third transistor T3.

It should be noted that, at the end of the reset phase, the voltage levels at the first end and the second end of the first capacitor C1 are both low.

In the hold phase, the pre-charge signal provided by the pre-charge signal input terminal INPUT is of a low level, and the reset signal provided by the reset signal input terminal RESET is of a low level. Thus, the sixth transistor T6 and the seventh transistor T7 are both turned off. The voltage level at the pulling-up node PU maintains low, the voltage level at the pulling-down node PD maintains high, the fifteenth transistor T15 maintains on, and the signal output terminal OUTPUT keeps outputting a low level.

Specifically, the hold phase includes a first hold sub-phase and a second hold sub-phase which are alternate.

In the first hold sub-phase, since the second clock signal is of a low level, the fifth transistor T5 is turned off, and since the fourth transistor is also turned off, the first end of the first capacitor C1 is floating. At the same time, since the first clock signal provided by the first clock signal terminal CLK1 transits from a low level to a high level, the voltage level at the second end of the first capacitor C1 jumps from a low level to a high level, and the voltage level at the first end of the first capacitor C1 jumps from a low level to a high level due to the bootstrapping effect of the first capacitor C1, that is, the voltage level at the voltage synchronization node A is high.

In each of the driving signal output sub-circuits 5, since the signal output terminal OUTPUT of the shift register SR outputs the low level, the first transistor T1 is turned off, and since the second clock signal is of a low level, the third transistor T3 is turned on. At the same time, since the voltage level at the voltage synchronization node A is high, the second transistor T2 is turned on, and the OFF voltage provided by the first power supply terminal is transmitted to the gate lines GATE1 to GATE6 via the second transistor T2 to maintain the voltages of the gate lines GATE1 to GATE6 to be the OFF voltage.

In the second hold sub-phase, since the second clock signal is of a high level, the fifth transistor T5 is turned on. At this time, the voltage synchronization node A is charged via the fifth transistor T5 through the second power supply terminal, and the voltage level at the voltage synchronization node A is low.

In each of the driving signal output sub-circuits 5, since the signal output terminal OUTPUT of the shift register SR outputs the low level, the first transistor T1 is turned off, and since the voltage level at the voltage synchronization node A is low, the second transistor T2 is turned off. At the same time, since the second clock signal is of a high level, the third transistor T3 is turned on, and the OFF voltage provided by the first power supply terminal is transmitted to the gate lines GATE1 to GATE6 via the third transistor T3 to maintain the voltages of the gate lines GATE1 to GATE6 to be the OFF voltage.

It can be seen that in the entire hold phase, the OFF voltage provided by the first power supply terminal is transmitted, via the second transistor T2 and the third transistor T3 alternately, to the gate lines GATE1 to GATE6, so as to maintain the voltages of the gate lines GATE1 to GATE6 to be the OFF voltage, thereby avoid the offset of the voltages of the gate lines GATE1 to GATE6.

In the gate driving unit circuit according to the embodiments of the present disclosure, one shift register can drive the plurality of gate lines, so the number of shift registers in the gate driving circuit can be greatly reduced, thereby effectively reducing the occupied space of the gate driving circuit and facilitating the narrow bezel of the display panel.

It should be noted that the structure of the shift register shown in the above embodiments is only for exemplary purpose, and does not limit the technical solution of the present disclosure.

Figure 10:
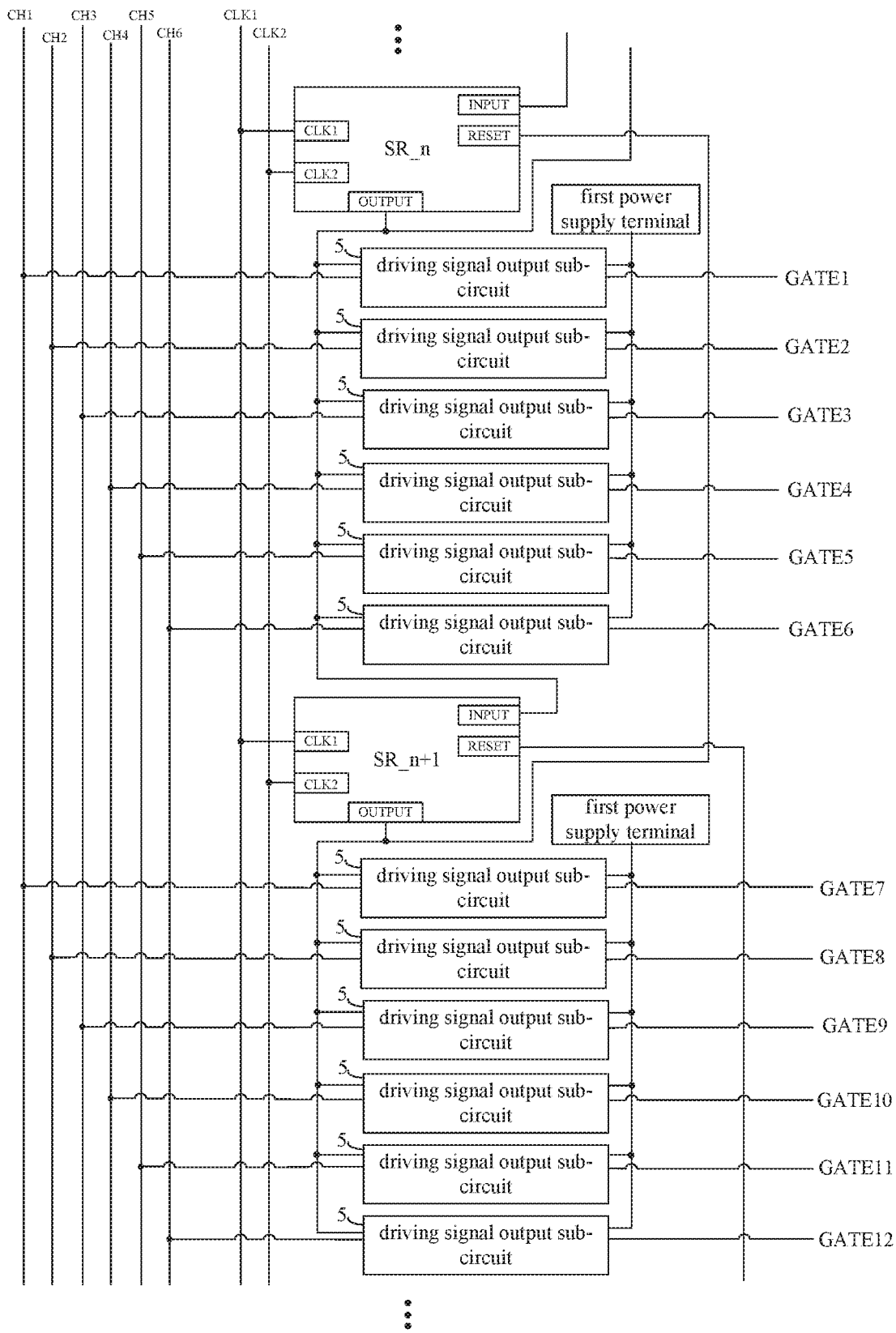
FIG. 10 is a schematic diagram illustrating a structure of a gate driving circuit according to an embodiment of the present disclosure.

FIG. 10 is a schematic diagram illustrating a structure of a gate driving circuit according to an embodiment of the present disclosure. As illustrated in FIG. 10, the gate driving circuit includes multiple cascaded stages of gate driving unit circuits.

Each of the gate driving unit circuits is any one of the gate driving unit circuits according to the above embodiments, and a specific structure thereof may be referred to the description in the above embodiments, the details of which will not be described here.

In the present embodiment, the signal output terminal OUTPUT of the shift register SR_n of a current stage of gate driving unit circuit is coupled to the pre-charge signal input terminal INPUT of the shift register SR_n+1 of a next stage of gate driving unit circuit, and the signal output terminal OUTPUT of the shift register SR_n+1 of the next stage of gate driving unit circuit is coupled to the reset signal input terminal RESET of the shift register SR_n of the current stage of gate driving unit circuit.

The embodiments of the present disclosure provides a gate driving circuit, in which one shift register can be employed to control the driving of the plurality of gate lines, so the number of shift registers in the gate driving circuit can be greatly reduced, thereby effectively reducing the occupied space of the gate driving circuit and facilitating the narrow bezel of the display panel.

The embodiments of the present disclosure provide a display apparatus including a gate driving circuit. The gate driving circuit is the gate driving circuit according to the above embodiments, and a specific structure thereof may be referred to the description in the above embodiments, the details of which will not be described here.

Figure 11:
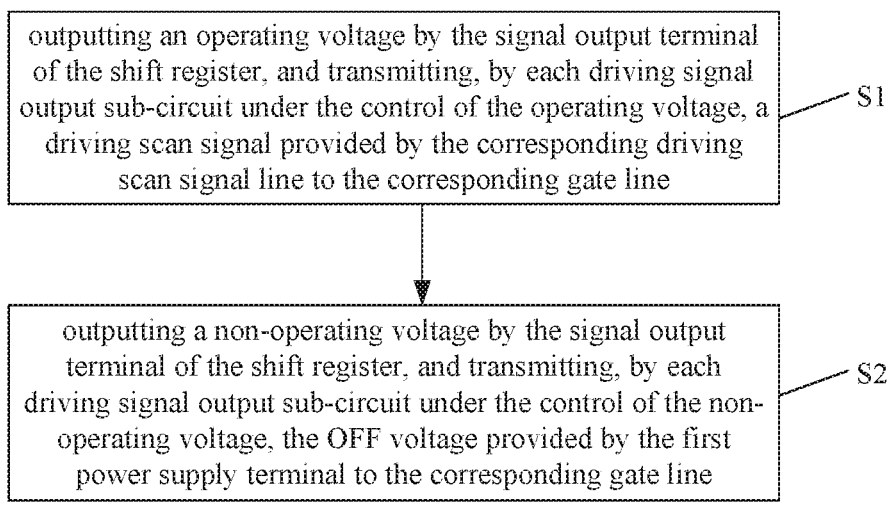
FIG. 11 is a flow chart illustrating a method of driving a gate driving unit circuit according to an embodiment of the present disclosure.

FIG. 11 is a flow chart illustrating a method of driving a gate driving unit circuit according to an embodiment of the present disclosure. The gate driving unit circuit is the gate driving unit circuit according to the above embodiments, the detailed description of which may be referred to the corresponding content of the foregoing embodiments. As illustrated in FIG. 11, the method of driving the gate driving unit circuit includes steps S1 and S2.

In step S1, an operating voltage is output through the signal output terminal of the shift register, and a driving scan signal provided by the corresponding one of the driving scan signal lines is transmitted to the corresponding one of the gate lines by each of the driving signal output sub-circuits under the control of the operating voltage.

For a detailed description of the above step S1, reference may be made to the corresponding description of the "output phase" in the foregoing embodiments.

In step S2, a non-operating voltage is output through the signal output terminal of the shift register, and the OFF voltage provided by the first power supply terminal is transmitted to the corresponding one of the gate lines by each of the driving signal output sub-circuits under the control of the non-operating voltage.

For a detailed description of the above step S2, reference may be made to the corresponding description of the "pre-charge phase", the "reset phase", and the "hold phase" in the foregoing embodiments.

The embodiments of the present disclosure provide a method of driving a gate driving unit circuit, in which one shift register is employed to control the driving of the plurality of gate lines, so the number of shift registers in the gate driving circuit can be greatly reduced, thereby effectively reducing the occupied space of the gate driving circuit and facilitating the narrow bezel of the display panel.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present invention, and these variations and improvements shall also fall into the protection scope of the present disclosure.

What is claimed is:

1. A gate driving unit circuit, comprising:
a shift register and a plurality of driving signal output sub-circuits,
wherein each of the driving signal output sub-circuits is coupled to a corresponding one of a plurality of gate lines on an array substrate, coupled to a first power supply terminal and a signal output terminal of the shift register, and coupled to a corresponding and different one of driving scan signal lines, and time periods in which respective driving scan signals provided by the driving scan signal lines are of an ON voltage do not overlap with each other, and
each of the driving signal output sub-circuits is configured to output, under control of a signal output by the signal output terminal of the shift register, a driving scan signal provided by the corresponding one of the driving scan signal lines or an OFF voltage provided by the first power supply terminal to the corresponding one of the gate lines,
wherein the shift register comprises a pre-charge reset sub-circuit, a pulling-down node control sub-circuit, an output control sub-circuit and an output reset sub-circuit, the pre-charge reset sub-circuit, the pulling-down node control sub-circuit and the output control sub-circuit being coupled to a pulling-up node, and the output control sub-circuit and the output reset sub-circuit being coupled to a pulling-down node,
wherein the pre-charge reset sub-circuit is configured to perform a pre-charge processing on the pulling-up node under control of a pre-charge signal input by a pre-charge signal input terminal and a reset processing on the pulling-up node under control of a reset signal input by a reset signal input terminal,
the output control sub-circuit is coupled to a first clock signal terminal, and configured to transmit a first clock signal provided by the first clock signal terminal to the signal output terminal under control of a voltage level at the pulling-up node, the pulling-down node control sub-circuit is coupled to a second clock signal terminal, and configured to transmit a second clock signal provided by the second clock signal terminal to the pulling-down node under control of the voltage level at the pulling-up node, the output reset sub-circuit is configured to reset the signal output terminal under control of a voltage level at the pulling-down node, the first clock signal and the second clock signal have a same period and a phase difference of a half of a period, wherein the shift register further comprises a voltage synchronization sub-circuit which comprises a fourth transistor and a first capacitor, a control electrode of the fourth transistor is coupled to the pulling-up node, a first electrode of the fourth transistor is coupled to a second power supply terminal, and a second electrode of the fourth transistor is coupled to a first end of the first capacitor at a voltage synchronization node, a second end of the first capacitor is coupled to the first clock signal terminal, and wherein the number of the driving signal output sub-circuits is six.

2. The gate driving unit circuit of claim 1, wherein the voltage synchronization sub-circuit further comprises a fifth transistor, a control electrode of the fifth transistor is coupled to the second clock signal terminal, a first electrode of the fifth transistor is coupled to the second power supply terminal, and a second electrode of the fifth transistor is coupled to the voltage synchronization node.

3. The gate driving unit circuit of claim 1, wherein the driving signal output sub- circuit comprises a first transistor and a second transistor,
a control electrode of the first transistor is coupled to the signal output terminal of the shift register, a first electrode of the first transistor is coupled to the corresponding one of the driving scan signal lines, and a second electrode of the first transistor is coupled to the corresponding one of the gate lines, and
a control electrode of the second transistor is coupled to the voltage synchronization node, a first electrode of the second transistor is coupled to the first power supply terminal, and a second electrode of the second transistor is coupled to the corresponding one of the gate lines.

4. The gate driving unit circuit of claim 3, wherein the driving signal output sub-circuit further comprises a third transistor, and
a control electrode of the third transistor is coupled to the second clock signal terminal, a first electrode of the third transistor is coupled to the first power supply terminal, and a second electrode of the third transistor is coupled to the corresponding one of the gate lines.

5. The gate driving unit circuit of claim 1, wherein the plurality of driving signal output sub-circuits are arranged in a column direction.

6. A gate driving circuit, comprising N cascaded stages of gate driving unit circuits, each of the gate driving unit circuits being the gate driving unit circuit of claim 1, where N is an integer greater than or equal to two,
the signal output terminal of the shift register of each of a first stage to a (N−1)-th stage of gate driving unit circuits, among the N cascaded stages of gate driving unit circuits, is coupled to the pre-charge signal input terminal of the shift register of a subsequent stage of gate driving unit circuit, among the N cascaded stages of gate driving unit circuits, and the signal output terminal of the shift register of each of a second stage to a N-th stage of gate driving unit circuits, among the N cascaded stages of gate driving unit circuits, is coupled to the reset signal input terminal of the shift register of a previous stage of gate driving unit circuit, among the N cascaded stages of gate driving unit circuits.

7. A display apparatus, comprising the gate driving circuit of claim 6.

* * * * *